(12) United States Patent
Verma et al.

(10) Patent No.: US 12,038,484 B2
(45) Date of Patent: Jul. 16, 2024

(54) APPARATUS AND METHOD FOR ESTIMATING SPECIFIC CAPACITY OF ELECTRODE

(71) Applicant: Samsung Electronics Co., Ltd., Suwon-si (KR)

(72) Inventors: Mohan Kumar Singh Verma, Bangalore (IN); Shashishekara Parampalli Adiga, Bangalore (IN); Rajkumar Subhash Patil, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 518 days.

(21) Appl. No.: 17/199,946

(22) Filed: Mar. 12, 2021

(65) Prior Publication Data

US 2021/0302506 A1 Sep. 30, 2021

(30) Foreign Application Priority Data

Mar. 27, 2020 (IN) .............................. 202041013382
Dec. 22, 2020 (KR) ......................... 10-2020-0180724

(51) Int. Cl.
*G01R 31/387* (2019.01)
*G01R 31/367* (2019.01)
*G01R 31/392* (2019.01)
*H01M 10/48* (2006.01)

(52) U.S. Cl.
CPC ......... *G01R 31/387* (2019.01); *G01R 31/367* (2019.01); *G01R 31/392* (2019.01); *H01M 10/482* (2013.01)

(58) Field of Classification Search
CPC ............................ G01R 31/387; G01R 31/392
USPC ........................................................ 702/63
See application file for complete search history.

(56) References Cited

U.S. PATENT DOCUMENTS

| 8,617,746 | B2 | 12/2013 | Mah et al. | |
|---|---|---|---|---|
| 9,991,509 | B2 | 6/2018 | Yoo et al. | |
| 2013/0002199 | A1* | 1/2013 | Hu | H02J 7/007182 320/112 |
| 2015/0118567 | A1 | 4/2015 | Chen | |
| 2017/0033572 | A1* | 2/2017 | Becker | G01R 31/396 |

(Continued)

FOREIGN PATENT DOCUMENTS

| JP | 2018-73463 A | 5/2018 |
|---|---|---|
| JP | 2019-50094 A | 3/2019 |

OTHER PUBLICATIONS

Fu, Rujian, et al. "Comparison of lithium-ion anode materials using an experimentally verified physics-based electrochemical model." *Energies* 10.12 (2017): 2174. (20 pages in English).

*Primary Examiner* — Ricky Go
(74) *Attorney, Agent, or Firm* — NSIP Law

(57) ABSTRACT

A method of estimating a maximum specific capacity of a composite electrode includes generating open circuit potential (OCP) crossover characteristics of the composite electrode comprising silicon and natural graphite, determining a composite electrode lithiation limit of the composite electrode based on a silicon lithiation limit of the silicon, predicting a composite electrode composition of the composite electrode based on the composite electrode lithiation limit, and estimating the maximum specific capacity of the composite electrode based on the composite electrode composition.

16 Claims, 18 Drawing Sheets

(56) References Cited

U.S. PATENT DOCUMENTS

2017/0194669 A1\* 7/2017 Christensen ........ H01M 10/615
2017/0346079 A1 11/2017 Friend et al.
2019/0148718 A1 5/2019 Hatazawa et al.
2021/0359347 A1\* 11/2021 Stefanopoulou .. H01M 10/0525

\* cited by examiner

APPARATUS AND METHOD FOR ESTIMATING SPECIFIC CAPACITY OF ELECTRODE

CROSS-REFERENCE TO RELATED APPLICATIONS

This application claims the benefit under 35 USC § 119(a) of Indian Patent Application No. 202041013382, filed on Mar. 27, 2020, in the Intellectual Property INDIA, and Korean Patent Application No. 10-2020-0180724, filed on Dec. 22, 2020, in the Korean Intellectual Property Office, the entire disclosures of which are incorporated herein by reference for all purposes.

BACKGROUND

1. Field

The following description relates to an apparatus and method for estimating specific capacity of electrode.

2. Description of Related Art

Silicon (Si) is regarded as one of the most promising anode materials due to its high theoretical capacity (for example, 4200 mAh/gm, or less) for next-generation lithium-ion batteries.

However, since a lifespan of Si is limited due to an anode particle pulverization and a subsequent capacity degradation associated with great volume expansion/contraction (for example, 300% or less) during cycling, actual implementation is limited. To extend a cycle life, Si is used with graphite (C) in a composite anode. However, this prevents realization of full benefits of Si. In fact, the maximum amount of Si contained in an Si/C composite anode is currently limited to 15%, and the maximum energy density of 23 Wh/gm or less is often realized.

In other words, it may be found that the maximum energy density is low due to a low maximum Si content in the composite anode.

Thus, it is desirable to identify an Si/C composite anode composition and a state of charge (SOC) operating range.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In another general aspect, a method of estimating a maximum specific capacity of a composite electrode includes generating open circuit potential (OCP) crossover characteristics of the composite electrode comprising silicon and natural graphite, determining a composite electrode lithiation limit of the composite electrode based on a silicon lithiation limit of the silicon, predicting a composite electrode composition of the composite electrode based on the composite electrode lithiation limit, and estimating the maximum specific capacity of the composite electrode based on the composite electrode composition.

The method may further include estimating a maximum extractable capacity of the composite electrode based on the composite electrode composition.

The maximum extractable capacity of the composite electrode may be estimated based on any one or any combination of an operating range of the composite electrode, an initial porosity, and a maximum allowable swelling.

The generating of the OCP crossover characteristics of the composite electrode may include determining a silicon OCP characteristic of the silicon in the composite electrode, determining a natural graphite OCP characteristic of the natural graphite in the composite electrode, and generating the OCP crossover characteristics of the composite electrode based on the silicon OCP characteristic and the natural graphite OCP characteristic.

The determining of the composite electrode lithiation limit based on the silicon lithiation limit may include determining a preset particle size silicon lithiation limit for a preset particle size of the silicon, determining a preset particle size composite electrode lithiation limit for a preset particle size of the composite electrode based on the preset particle size silicon lithiation limit, and determining an entire composite electrode lithiation limit for an entire composite electrode based on the preset particle size silicon lithiation limit.

The predicting of the composite electrode composition of the composite electrode based on the composite electrode lithiation limit may include estimating a safe operating range of the silicon in the composite electrode in which the silicon does not fracture, based on the composite electrode lithiation limit, determining a composition of the silicon in the composite electrode based on a maximum value of the silicon in the estimated safe operating range, and predicting the composite electrode composition based on the maximum value of the silicon in the composite electrode.

The maximum specific capacity of the composite electrode may be estimated based on any one or any combination of an operating range of the composite electrode, an initial porosity, and a maximum allowable swelling.

In another general aspect, an apparatus for estimating a specific capacity of an electrode includes a crossover characteristic generator configured to generate open circuit potential (OCP) crossover characteristics of a composite electrode comprising silicon and natural graphite, a lithiation limit determiner configured to determine a composite electrode lithiation limit of the composite electrode based on a silicon lithiation limit of the silicon, a composite electrode composition predictor configured to predict a composite electrode composition of the composite electrode based on the composite electrode lithiation limit, and a specific capacity estimator configured to estimate a maximum specific capacity of the composite electrode based on the composite electrode composition.

The apparatus may further include an extractable capacity estimator configured to estimate a maximum extractable capacity of the composite electrode based on the composite electrode composition.

The maximum extractable capacity of the composite electrode may be estimated based on any one or any combination of an operating range of the composite electrode, an initial porosity, and a maximum allowable swelling.

The crossover characteristic generator may be further configured to determine a silicon OCP characteristic of the silicon in the composite electrode, to determine a natural graphite OCP characteristic of the natural graphite in the composite electrode, and to generate the OCP crossover characteristics of the composite electrode based on the silicon OCP characteristic and the natural graphite OCP characteristic.

The lithiation limit determiner may be further configured to determine a preset particle size silicon lithiation limit for a preset particle size of the silicon, to determine a preset particle size composite electrode lithiation limit for a preset particle size of the composite electrode based on the preset particle size silicon lithiation limit, and to determine an entire composite electrode lithiation limit for an entire composite electrode based on the preset particle size silicon lithiation limit.

The composite electrode composition predictor may be further configured to estimate a safe operating range of the silicon in the composite electrode in which the silicon does not fracture, based on the composite electrode lithiation limit, to determine a composition of the silicon in the composite electrode based on a maximum value of the silicon in the estimated safe operating range, and to predict the composite electrode composition based on the maximum value of the silicon in the composite electrode.

The maximum specific capacity of the composite electrode may be estimated based on any one or any combination of an operating range of the composite electrode, an initial porosity, and a maximum allowable swelling.

A non-transitory computer-readable storage medium storing instructions that, when executed by one or more processors, may configure the one or more processors to perform the method above.

In another general aspect, an apparatus for estimating a specific capacity of an electrode includes one or more processors configured to generate open circuit potential (OCP) crossover characteristics of a composite electrode comprising silicon and natural graphite, determine a composite electrode lithiation limit of the composite electrode based on a silicon lithiation limit of the silicon, predict a composite electrode composition of the composite electrode based on the composite electrode lithiation limit, and estimate a maximum specific capacity of the composite electrode based on the composite electrode composition.

The data encoding apparatus may further include a memory configured to store instructions. The one or more processors may be further configured to execute the instructions to configure the one or more processors to generate the OCP crossover characteristics of the composite electrode comprising the silicon and the natural graphite, determine the composite electrode lithiation limit of the composite electrode based on the silicon lithiation limit of the silicon, predict the composite electrode composition of the composite electrode based on the composite electrode lithiation limit, and estimate the maximum specific capacity of the composite electrode based on the composite electrode composition.

and aspects will be apparent from the following detailed description, the drawings, and the claims.

Figure 1:
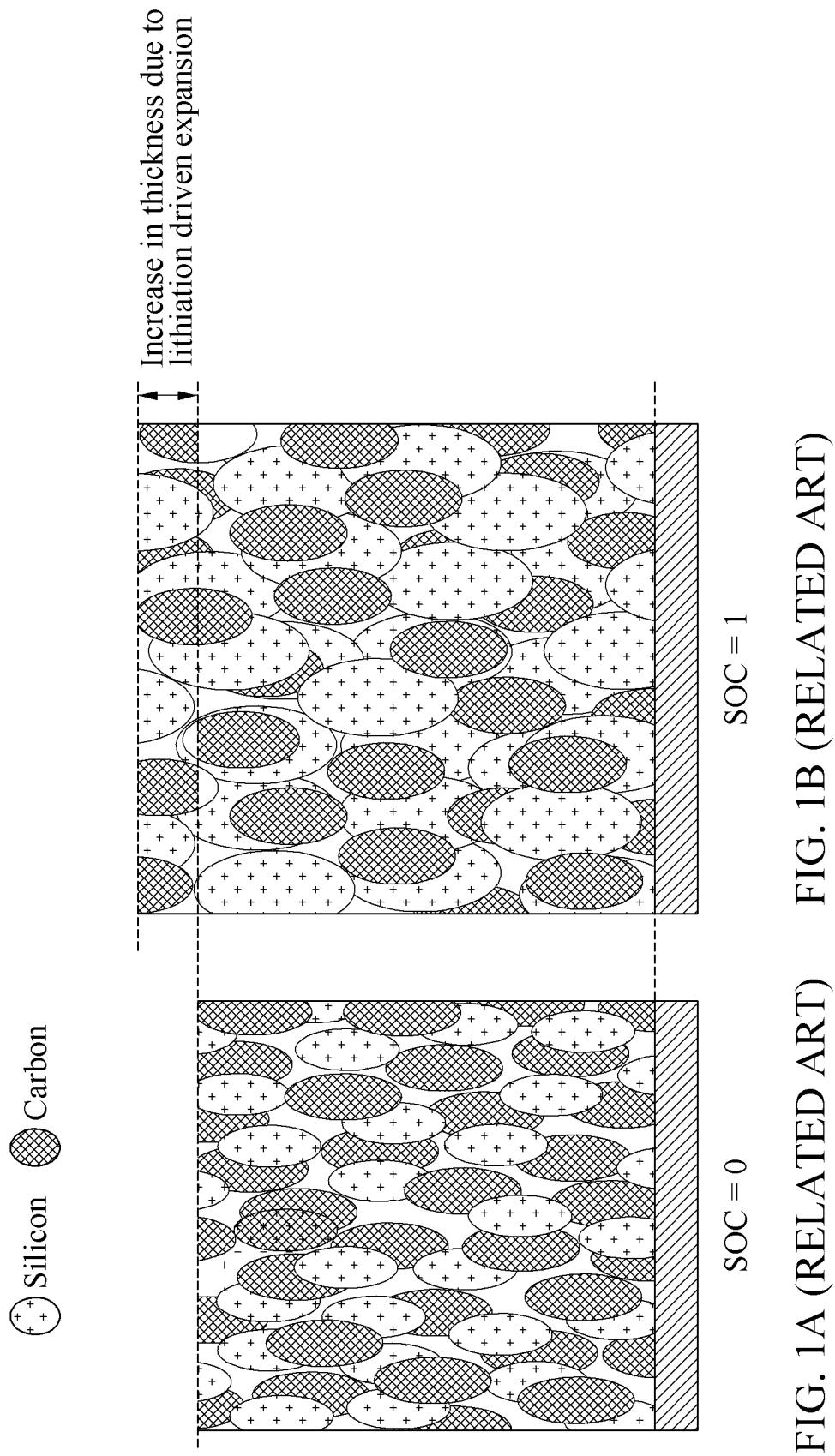
FIGS. 1A and 1B illustrate an increase in a thickness of an anode material based on lithiation according to a related art.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

The following description relates to a composite anode, and more particularly, to a method for determining a composition of a composite electrode.

Examples described provide a method of maximizing a specific capacity and an extractable capacity of a composite next-generation electrode including silicon (Si) and natural graphite (hereinafter, referred to as "NG" or "C"), based on open circuit potential (OCP) crossover characteristics. By the method described herein, OCP crossover characteristics of the composite next-generation electrode may be generated, and a lithiation limit of the composite next-generation electrode may be determined based on a lithiation limit of the Si. Also, by the method described herein, a composition of the composite next-generation electrode may be predicted based on the determined lithiation limit of the composite next-generation electrode. By the method described herein, a maximum specific capacity and a maximum extractable capacity of the composite next-generation electrode may be estimated based on the predicted composition of the composite next-generation electrode.

Unlike existing typical methods, using one or more methods described herein to determine a safe range of lithiation of an anode, an Si content in a composite anode may be increased to 36%.

Hereinafter, examples of an apparatus and method for estimating a specific capacity of an electrode will be described below with reference to FIGS. 1A to 10.

FIGS. 1A and 1B illustrate an increase in a thickness of an anode material based on lithiation according to a related art.

As illustrated in FIG. 1A, a composite anode may include Si and C having a state of charge (SOC) of "0." An SOC may be a level of charge of an electrode or a battery with respect to a total capacity. Values of the SOC may vary from "0" corresponding to a state in which lithium (Li) is completely depleted in an electrode to "1" corresponding to a state in which a Li content equals to a maximum capacity of the electrode.

In an example, the composite anode may belong to an electrode of a battery. When the battery is switched on, Li ions present in cathode materials may move to either Si or C of the composite electrode based on OCPs of the Si and the C. A transition of the Li ions may be referred to as "lithiation." However, the lithiation may result in volume expansion of the composite anode. Since the OCPs of the Si and the C may have different values, lithiation for the composite anode may be highly non-linear.

FIG. 1A indicates that since the SOC has a value of "0," there is no lithiation, and accordingly there is no change in a volume of the composite anode. However, as shown in FIG. 1B, the SOC of the composite anode has a value of "1," and accordingly a thickness of the composite anode is increased due to lithiation. Such an increase in the thickness and/or a change in the volume of the composite anode may be harmful to an electrode in batteries and may be allowed only to a predetermined extent.

Thus, there is a need to limit lithiation of Si with respect to lithiation of an anode such that there is no additional change in the volume of the composite anode. An SOC value of an electrode may indicate an extent of lithiation in the electrode. When the SOC value is "0," there is no lithiation, and when the SOC value is "1," the lithiation may be completed.

Figure 2:
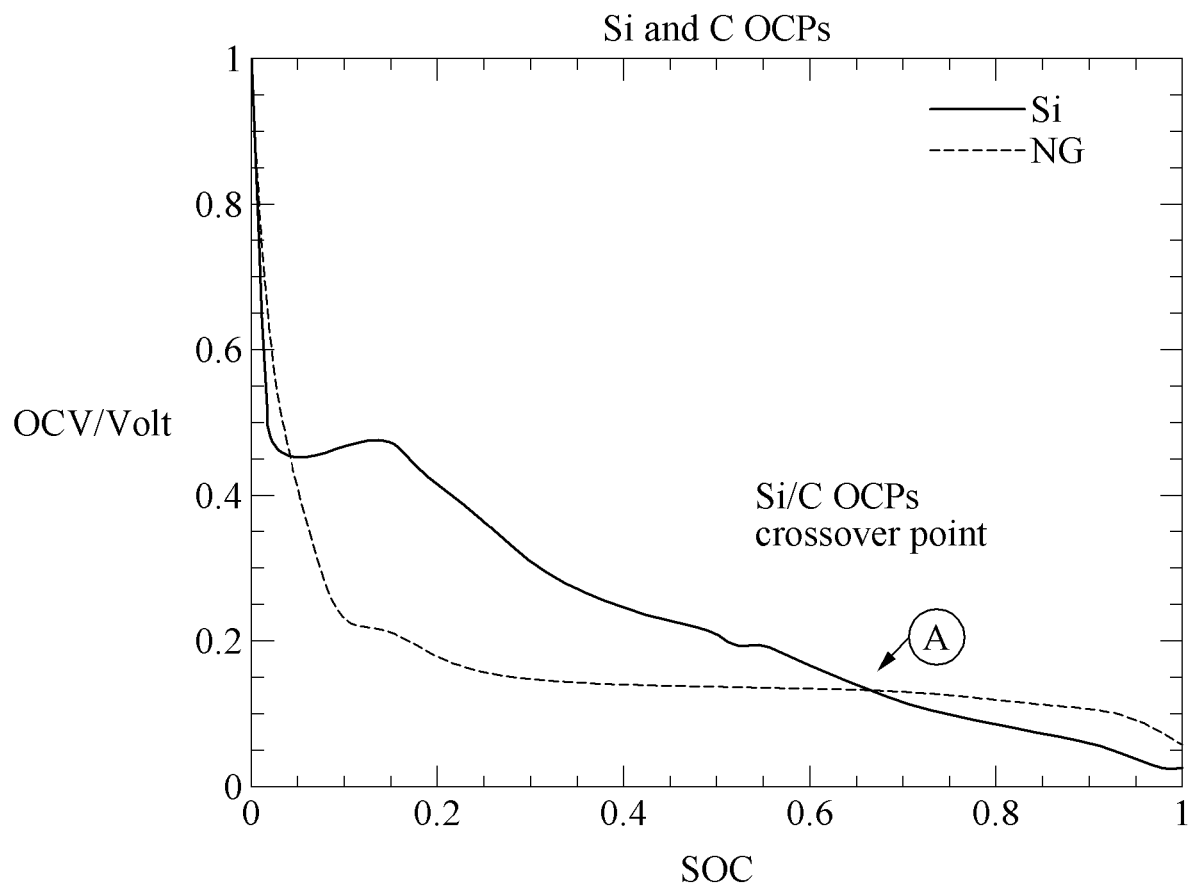
FIG. 2 is a graph illustrating an example of a state of charge (SOC) versus open circuit potentials (OCPs) for silicon (Si) and natural graphite (C).

FIG. 2 is a graph illustrating an example of an SOC versus OCPs for Si and C.

FIG. 2 illustrates a graph plotted between the SOC and the OCPs for the Si and the C. Shapes of OCPs of the Si and the C may be clearly different from each other. Potentials of the Si are higher than those of the NG at relatively low SOC value, and potentials of the NG is higher than those of the Si beyond a crossover point with an SOC value of "0.61."

As shown at a point A, characteristics for the Si and the C are the same and the point A may be referred to as a "crossover point." A difference in OCPs between pure materials may lead to different driving forces for lithiation of Si and NG particles in the composite anode and non-linear behavior of extents of lithiation of Si and NG with respect to the total SOC of the composite anode.

Figure 3:
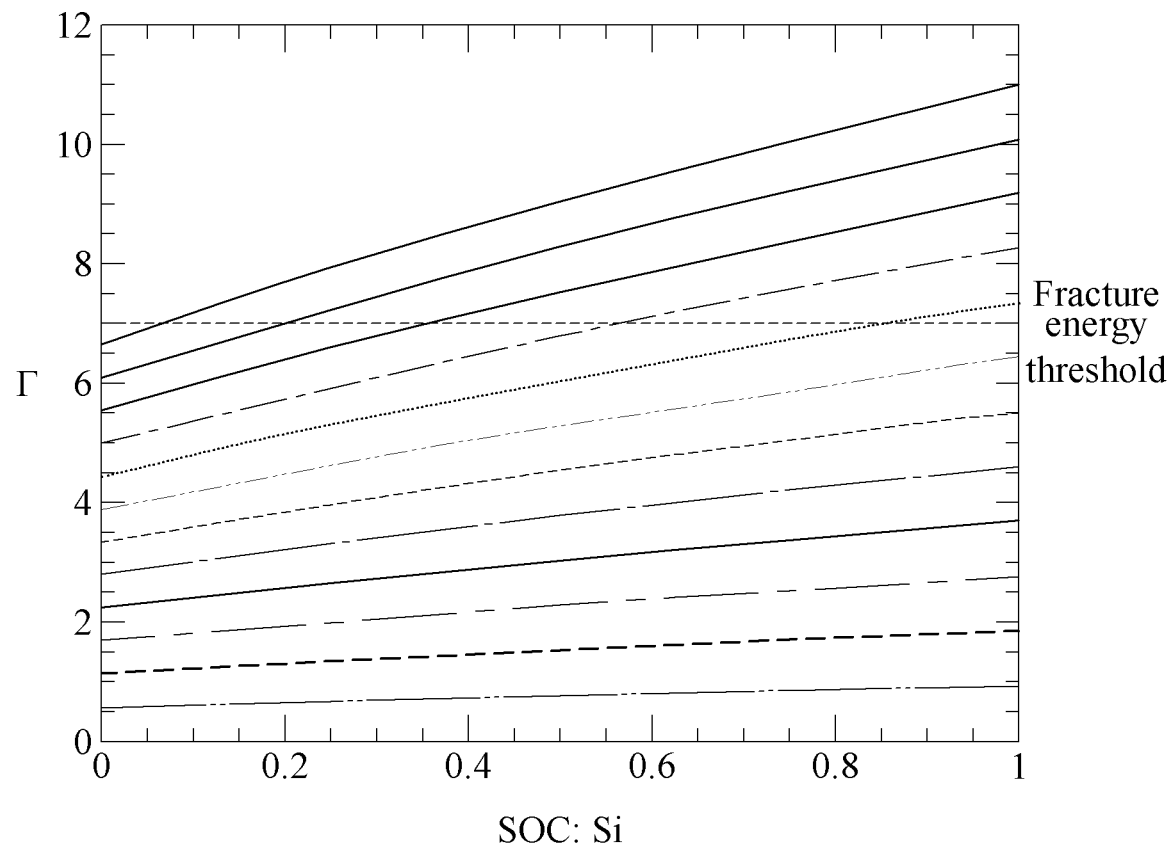
FIG. 3 is a graph illustrating an example of a fracture energy threshold for Si.

FIG. 3 is a graph illustrating an example of a fracture energy threshold for Si.

Si may tend to fracture if lithiated beyond a predetermined limit. The fracture of Si particles may lead to a loss of mechanical integrity, a loss of electrical contact, and a subsequent loss of an available electrode and a battery capacity. It is known that the Young's modulus of Si particles is dependent on an SOC through Equation 1 shown below (K. Higa and V. Srinivasan, Journal of The Electrochemical Society, 162 (6) A1111-A1122 (2015)).

$$E^{Si}(SOC^{Si}) = \frac{18.90 \times SOC^{Si} + 90.13}{1 + SOC^{Si}}$$

Also, from linear elastic fracture mechanics (Zhao et al., Journal of The Electrochemical Society, 159 (3) A238-A243 (2012)), an energy release rate due to a crack growth in an Si particle may be represented as shown in Equation 2 below.

$$\Gamma = \frac{Z\sigma_Y^2 b}{E^{Si}(SOC^{Si})} \quad \text{[Equation 2]}$$

In Equation 2, $\sigma Y=1$ GPa denotes a yield stress of Si, $Z=1$ denotes a dimensionless number, and b denotes a particle size of a nanometer scale.

Equation 2 may be used as a function of $SOC^{Si}$ for various particle sizes as shown in FIG. 3, to calculate r.

In FIG. 3, threshold energy $r_{cr}$ for a fracture of Si is 7 J/m$^2$ as indicated by a horizontal dotted line. For a given particle size, an SOC value of Si corresponding to an intersection of an SOC dependent energy release rate with the horizontal dotted line indicating the threshold energy $r_{cr}$ may provide a lithiation limit beyond which a fracture may occur. Thus, for a safe operation, an allowed maximum lithiation for a given particle size may be provided by the SOC value of the Si. The fracture energy threshold may be used to determine a maximum content of lithiation for Si before the Si begins to fracture. Determining of the fracture energy threshold for the Si may be useful for determination of lithiation of a composite anode. The fracture energy threshold may help in determining a safe range of Si lithiation where Si does not fracture. A lithiation limit for fracture may also depend on a particle size of Si. When the particle size of the Si increases, a lithiation limit for a fracture may decrease. A fracture mechanism may determine a maximum SOC value of Si in which a fracture occurs for a given particle size, and thus an SOC limit of Si for a safe operation may be determined.

Figure 4:
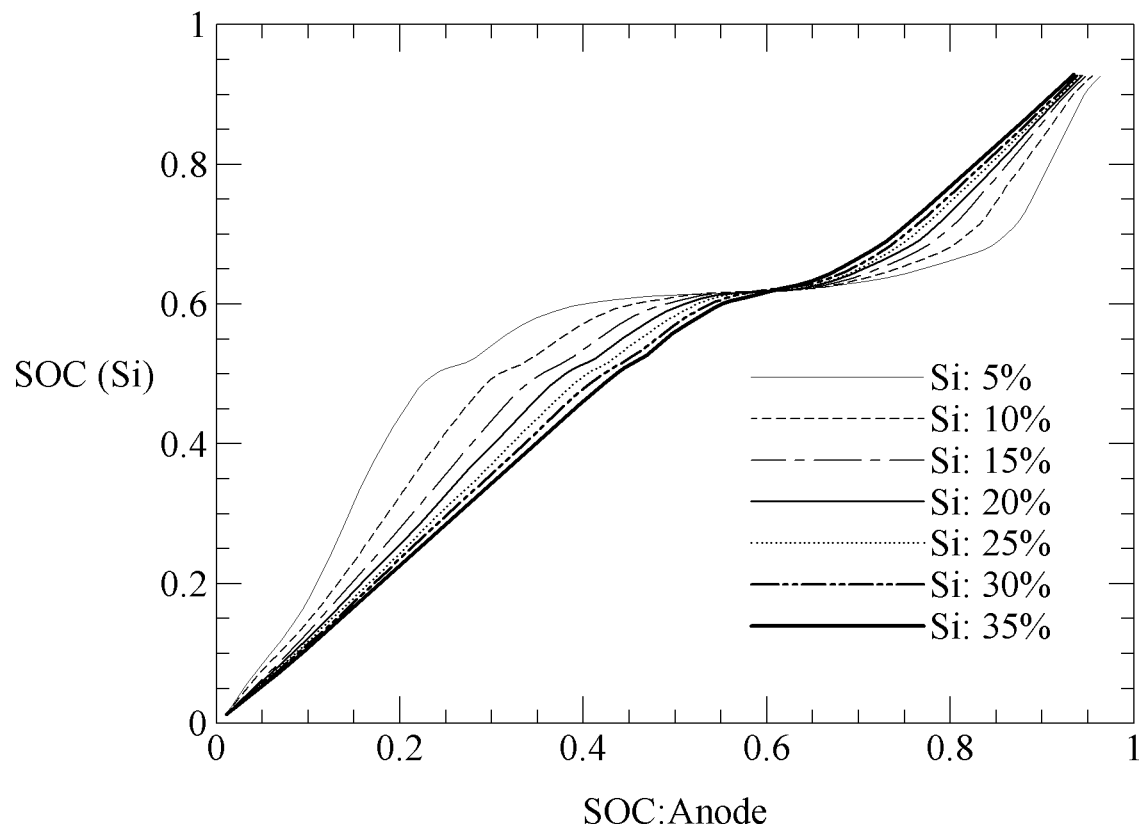
FIG. 4 is a graph illustrating an example of an SOC of a composite anode versus an SOC of Si.

When the SOC limit of the Si is determined, the SOC of the Si versus an anode SOC plot of FIG. 4 may be used to determine a corresponding anode SOC limit for a given weight fraction of the Si. Also, using the anode SOC limit, a maximum composition of Si in the composite anode may be determined for a given particle size.

As shown in FIG. 3, the fracture energy along an x-axis may be plotted against an SOC of Si on the x-axis. The graph may be plotted for different compositions of Si in the composite anode indicated by different lines. The fracture energy threshold is indicated by the horizontal dotted line in FIG. 3. An SOC value of Si corresponding to an intersection of the above plot with the horizontal dotted line indicating the fracture energy threshold may correspond to the SOC limit of the Si for each composition.

FIG. 4 is a graph illustrating an example of an SOC of a composite anode versus an SOC of Si.

As illustrated in FIG. 4, an x-axis represents the SOC of the composite anode and a y-axis represents the SOC of the Si. The graph of FIG. 4 shows various compositions of the Si in the composite anode ranging in a range of 5% to 35%.

For an example of FIG. 4, the following procedure will be described.

A weight averaged OCP of the composite anode may be modelled under an assumption that Si particles and NG particles in an anode experience the same potential at an arbitrary anode lithiation state. However, current may be split between the above materials based on a difference between electrode potentials and an OCP of an individual component material.

First, an OCP window of 0 volts (V) to 1 V (corresponding to a voltage range of Si and C individual OCPs) is taken into consideration, and a plot of the OCP versus the SOC of the composite anode is generated.

For a given composite OCP value V, in this range, Si and C component SOC values $SOC_i^{Si}$ and $SOC_i^C$, respectively, are determined based on the plot of the OCPs versus the SOC for Si and C of FIG. 2.

An SOC $SOC_i^a$ of the composite anode corresponding to the OCP value $V_i$ may be calculated using Equation 3 shown below.

$$SOC_i^a = \frac{SOC_i^{Si} C_{max}^{Si} w^{Si} + SOC_i^C C_{max}^C w^C}{C_{max}^{Si} w^{Si} + C_{max}^C w^C} \quad \text{[Equation 3]}$$

In Equation 3, $C_{cmax}^{Si}$ and $C_{max}^C$ denote a maximum Li concentration of Si and a maximum Li concentration of C, respectively, and $w^{Si}$ and $w^C$ denote a weight fraction of Si and a weight fraction of C, respectively, in the composite anode.

When the above calculation is performed for discrete values of OCPs of the composite anode in the range of 0 V to 1 V, the full OCP versus SOC for the composite anode may be generated. Similarly, using the same calculation, the plot of $SOC^{Si}$ versus SOC anode (FIG. 4) and a plot of $SOC^C$ versus SOC anode for a given Si/C weight fraction may be generated.

Figure 5:
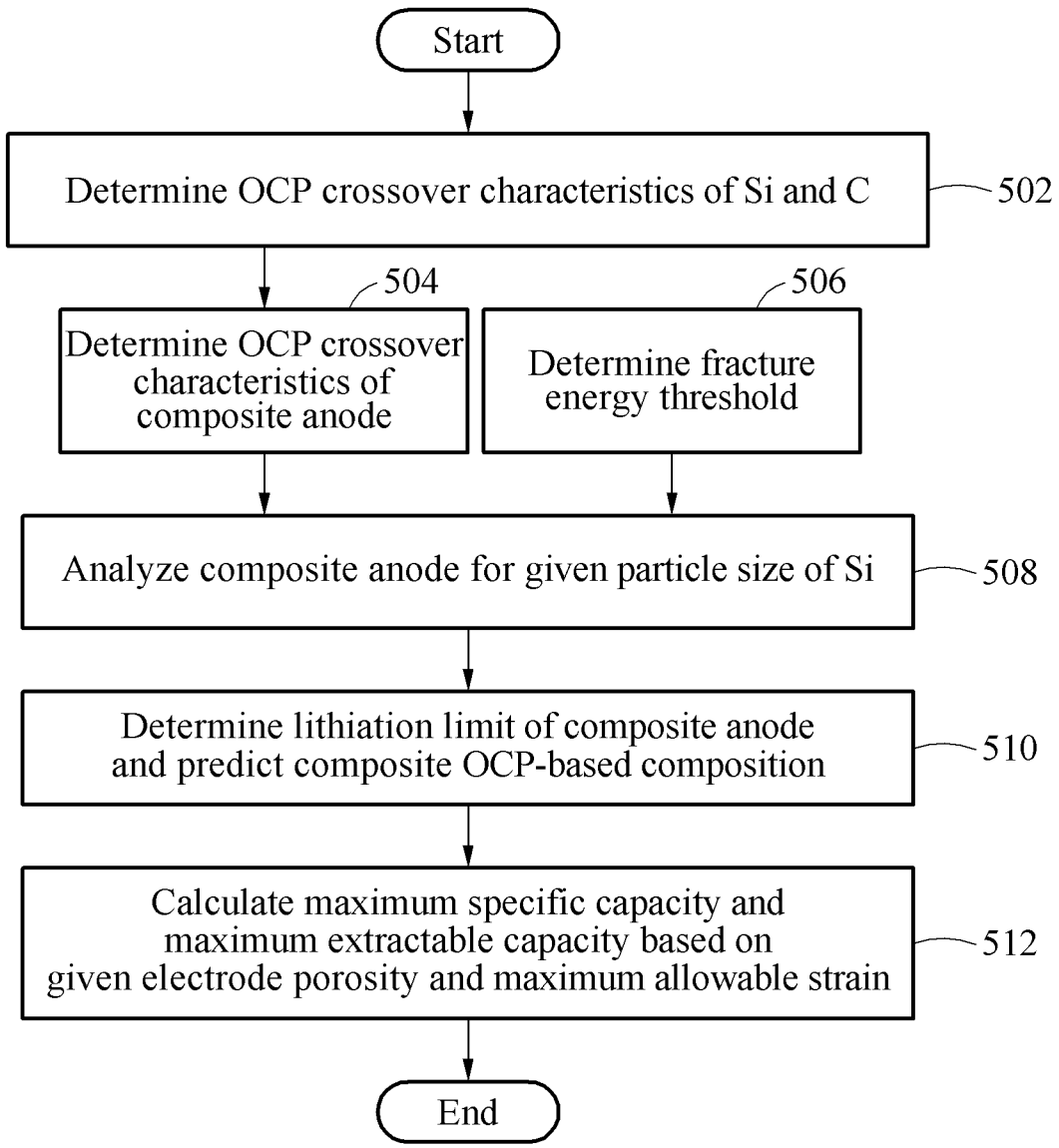
FIG. 5 illustrates an example of a method of maximizing a specific capacity and an extractable capacity of an Si/C composite next-generation electrode based on OCP crossover characteristics.

FIG. 5 illustrates an example of a method of maximizing a specific capacity and an extractable capacity of an Si/C composite next-generation electrode based on OCP crossover characteristics.

Referring to FIG. 5, in operation 502, OCP crossover characteristics of Si and C may be determined based on a composite anode including the Si and the C. Here, the OCP crossover characteristics of the Si and the C are shown in FIG. 2.

In operation 504, OCP characteristics of the composite anode may be determined based on the OCP crossover characteristics of the Si and the C.

In operation 506, a fracture energy threshold for a preset particle size of the Si may be determined as shown in FIG. 3.

In operation 508, the composite anode for a given particle size may be analyzed based on a lithiation limit of the Si and the OCP crossover characteristics of the composite anode.

In operation 510, a lithiation limit of the composite anode may be determined as shown in FIGS. 7A to 7D and a maximum composition of the Si in the composite anode for which the Si does not fracture may be estimated. The Si particle and an extent of lithiation of the Si particle may be used to determine prediction of a lithiation limit of the composite for a given composition.

In operation 512, a maximum achievable specific capacity and a maximum achievable gravimetric capacity of the composite anode may be determined. An electrode design parameter such as an initial porosity and an extent of swelling may be used to determine estimation of the maximum achievable specific capacity. The maximum achievable gravimetric capacity may be optimized for different particle sizes, compositions, and design parameters.

In an example, due to volume expansion of the composite electrode associated during lithiation, an electrode may be swollen, and a porosity of the electrode may decrease. Such phenomena may become of great importance when electrode particles, for example, Si, are prone to lithiation dependent fractures. Here, estimation of a lithiation dependent porosity variation for a range of Si/C weight fractions based on a composite volume expansion and a permitted swelling limit is described. A porosity ε of an electrode may be defined as shown in Equation 4 below.

$$\varepsilon = \frac{1 - \sum_i V_i}{V} \quad \text{[Equation 4]}$$

In Equation 4, $V_i$ denotes a volume of a solid component i, for example, Si, carbon, a binder, or a conductive filler, in an electrode. V denotes a total volume of an electrode. Since a volume of an electrode is expanded in response to lithiation of the electrode, a porosity may become a strong function of an SOC and a composition of individual components in the electrode.

Expansion of a volume of a material may vary depending on a lithiation rate, a phase change, a lattice parameter change, and transport properties.

Porosity evolution with an SOC may be represented as shown in Equation 5 below.

$$\varepsilon(SOC) = 1 - \frac{\sum_i V_i(1 + N_i \times SOC)}{V(1 + N_s \times SOC)} \quad \text{[Equation 5]}$$

In Equation 5, $N_i$ denotes a volume expansion rate of a component i and $N_s$ denotes maximum permitted volume expansion of an electrode.

For a given Si/C weight fraction $w_i$, an initial porosity $\varepsilon_0$ and a permitted swelling, Equation 5 may be represented as shown in Equation 6 below.

$$\varepsilon(SOC) = 1 - \frac{1 - \varepsilon_0}{(1 + N_S \times SOC)\sum_i \frac{w_i}{\rho_i}} \sum_i \left(\frac{w_i}{\rho_i}(1 + N_i \times SOC)\right) \quad \text{[Equation 6]}$$

In Equation 6, ρi denotes a density (gm/cm³) of the component i.

For estimation of a specific gravimetric analysis (Ga) and volumetric capacity $V_a$, a simple mass balance equation may be used.

An electrode density $\rho_a$ may be determined as a weight average mass density of solid components using Equation 7 shown below.

$$\rho_a = \frac{1 - \varepsilon(SOC)}{\sum_i \frac{w_i}{\rho_i}} \quad \text{[Equation 7]}$$

A specific gravimetric capacity may also be expressed as a weight average capacity of Si/C components using Equation 8 below.

$$G_a = w_{Si}G_{Si} + w_C G_C \quad \text{[Equation 8]}$$

A specific volumetric capacity may be estimated by multiplying the electrode density by the specific gravimetric capacity, as shown in Equation 9 below.

$$V_\alpha = \rho_\alpha G_\alpha \quad \text{[Equation 9]}$$

A weight fraction, a density and a gravimetric capacity of Si, graphite, binder, and conductive additives are provided in Table 1 below.

Table 1 shows the maximum specific capacity versus an Si composition in an electrode.

TABLE 1

| Particle size | Specific capacity (mAh/gm) | Si composition (%) | Initial porosity | Allowable expansion |
|---|---|---|---|---|
| 360 | 922-1076 | 20-236 | 0.3 | 0.1-0.2 |
| 360 | 1228-1349 | 30-36 | 0.4 | 0.1-0.2 |
| 360 | 1349 | 34-36 | 0.5 | 0.1-0.2 |

Figure 6A:
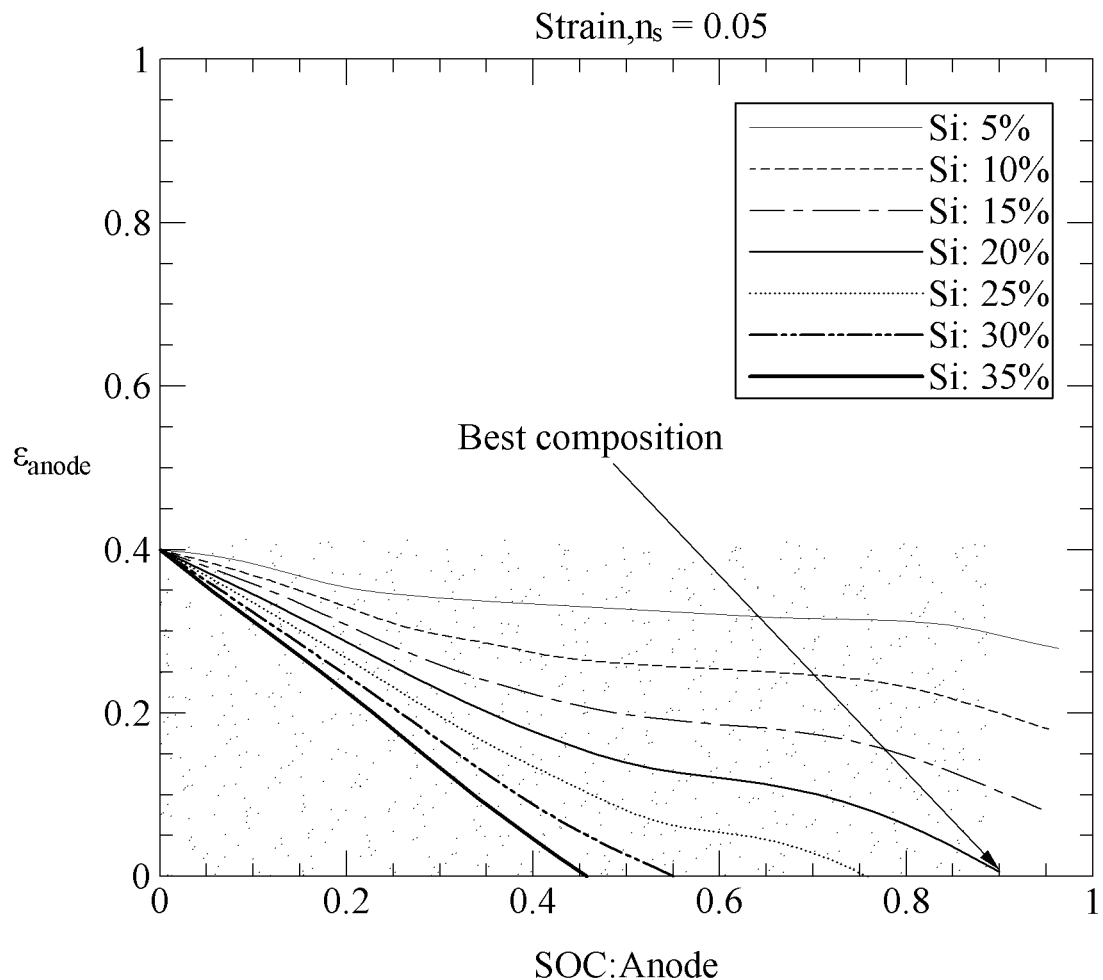
FIGS. 6A and 6B are graphs illustrating examples of determination of an optimum composition of a composite anode based on a particle size and an extent of lithiation.
Figure 6B:
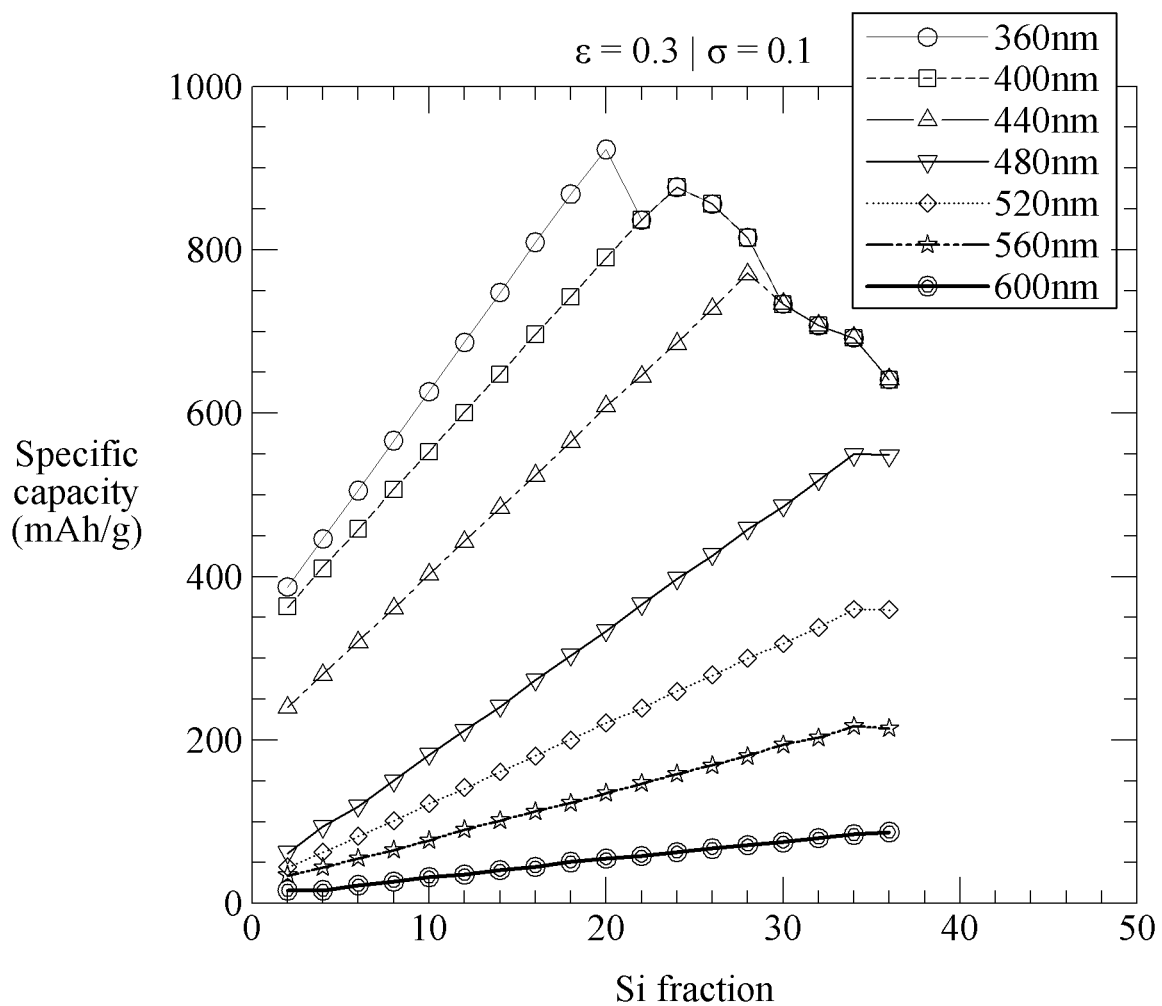

FIGS. 6A and 6B are graphs illustrating examples of determination of an optimum composition of a composite anode based on a particle size and an extent of lithiation.

FIGS. 7A to 7D are graphs illustrating examples of a specific capacity of an electrode for a particle size of 450 nm.

Figure 7A:
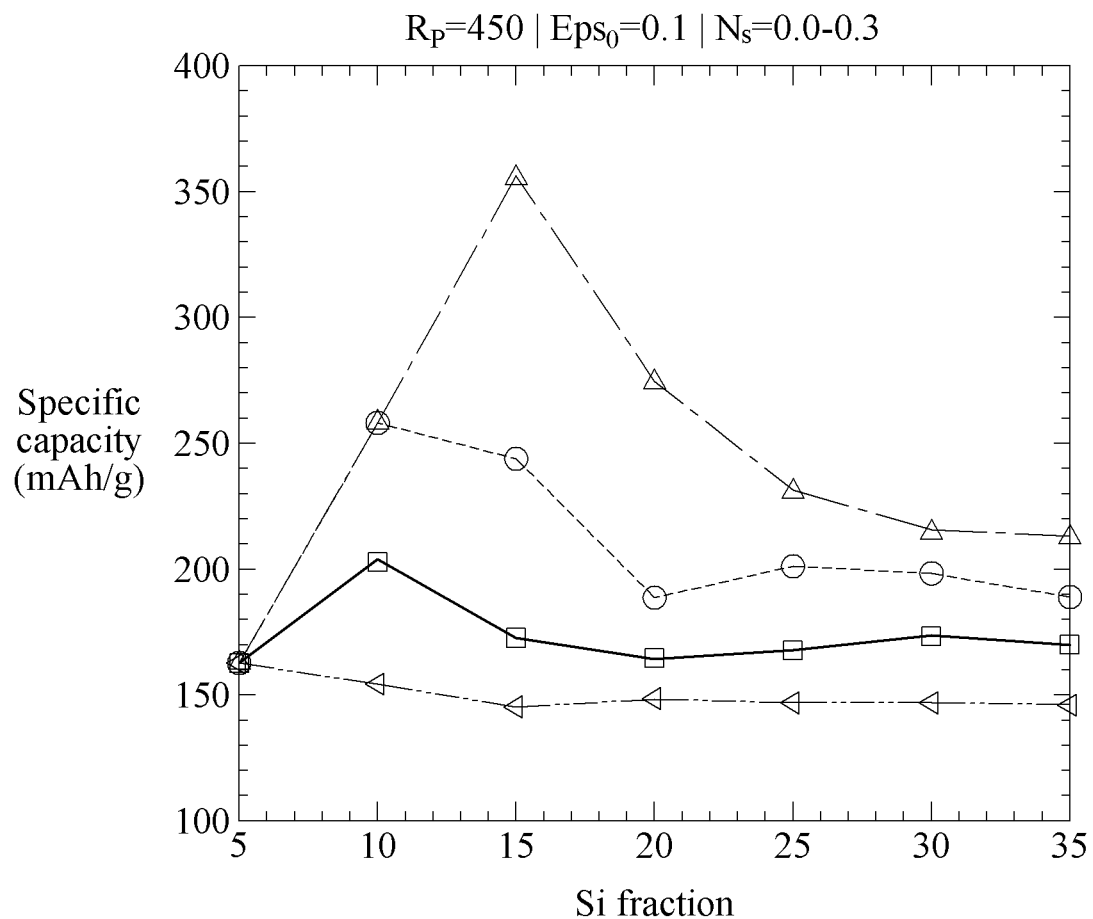
FIGS. 7A to 7D are graphs illustrating examples of a specific capacity of an electrode for a particle size of 450 nanometers (nm).

As shown in FIG. 7A, an x axis represents an Si fraction, and a y-axis represents a specific capacity in mAh/g. A maximum allowable swelling $N_s$ of the electrode ranges between "0" and "0.3." An initial electrode porosity $Eps_0$ is "0.1," and the particle size is 450 nm.

Figure 7B:
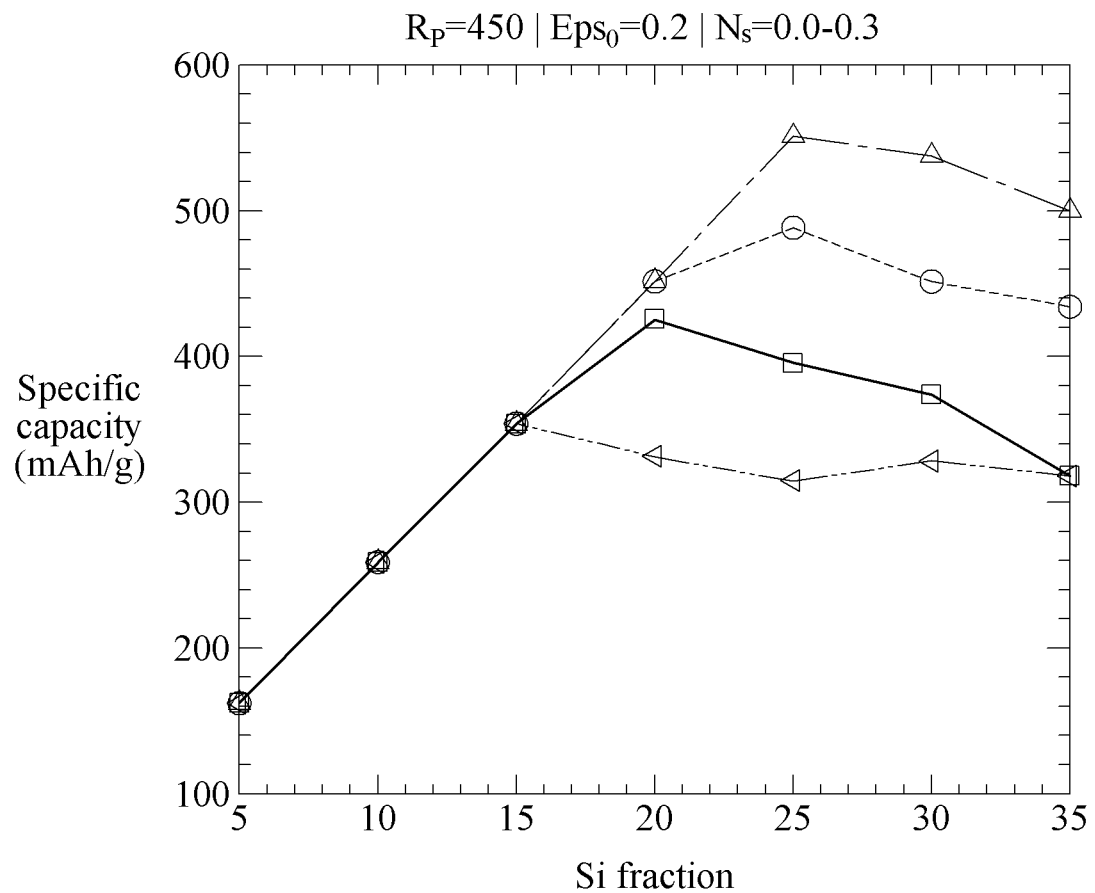

As shown in FIG. 7B, an x axis represents an Si fraction, and a y-axis represents a specific capacity in mAh/g. A maximum allowable swelling $N_s$ of the electrode ranges between "0" and "0.3." An initial electrode porosity $Eps_0$ is "0.2," and the particle size is 450 nm.

Figure 7C:
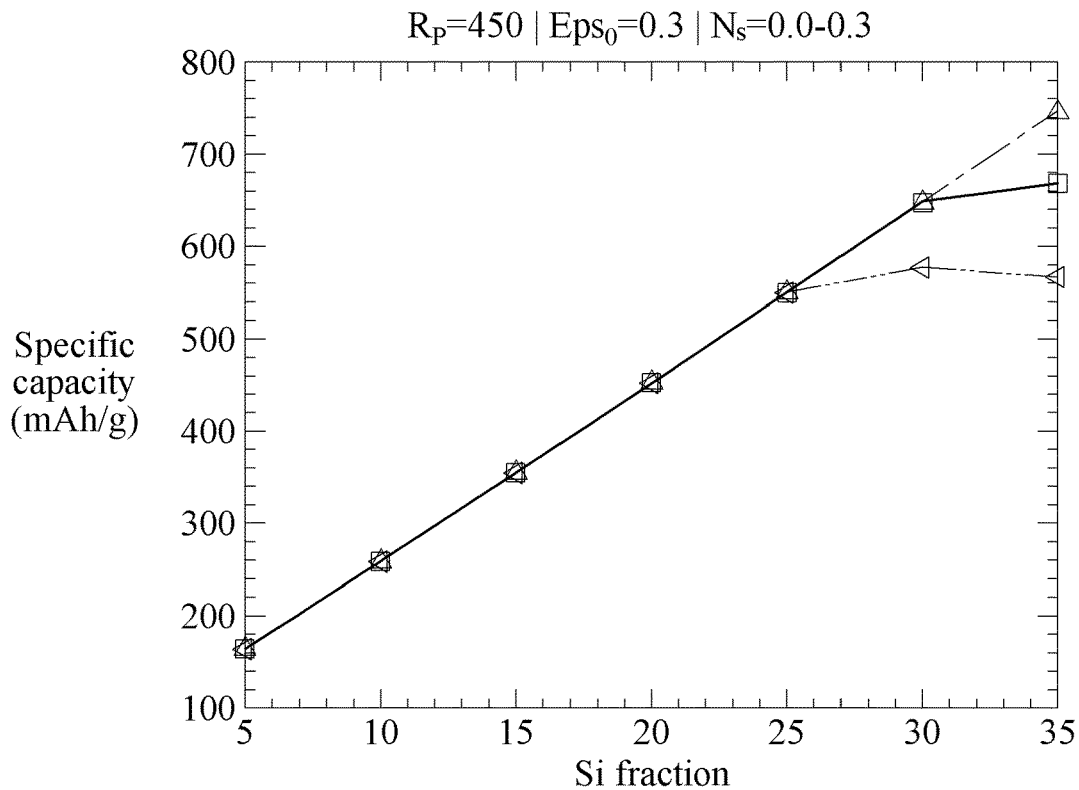

As shown in FIG. 7C, an x axis represents an Si fraction, and a y-axis represents a specific capacity in mAh/g. A maximum allowable swelling $N_s$ of the electrode ranges between "0" and "0.3." An initial electrode porosity $Eps_0$ is "0.3," and the particle size is 450 nm.

Figure 7D:
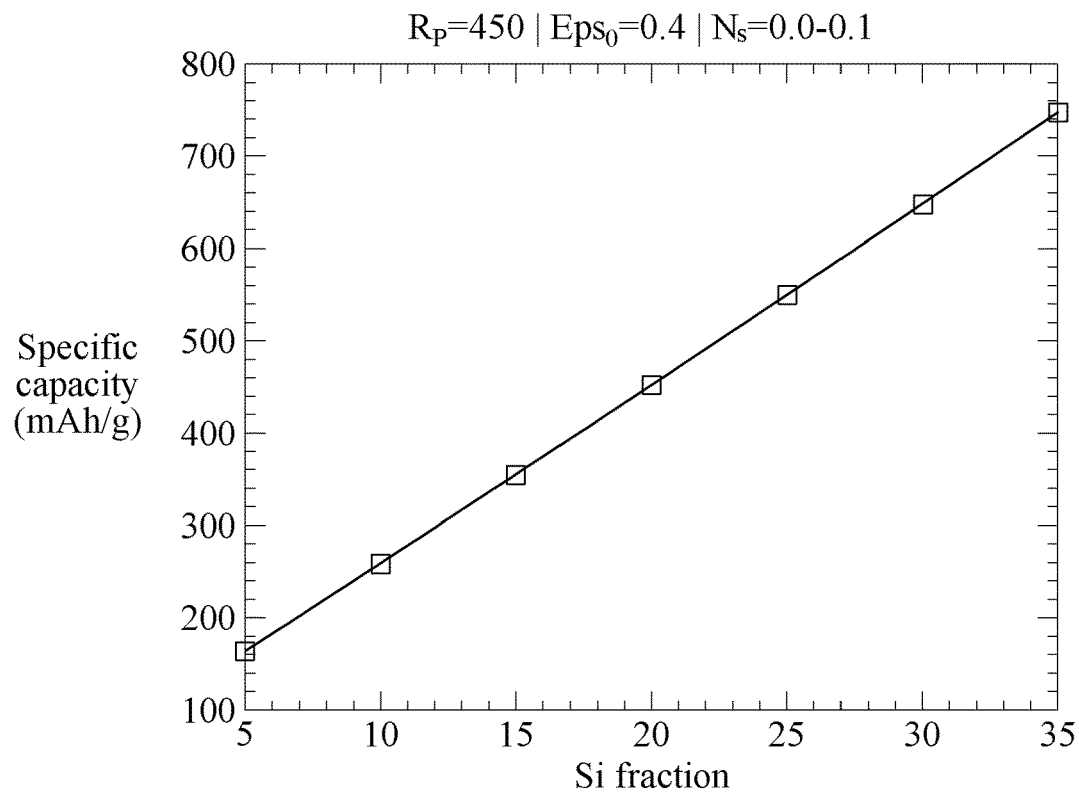

As shown in FIG. 7D, an x axis represents an Si fraction, and a y-axis represents a specific capacity in mAh/g. A maximum allowable swelling $N_s$ of the electrode ranges between "0" and "0.1." An initial electrode porosity $Eps_0$ is "0.4," and the particle size is 450 nm.

Figure 8A:
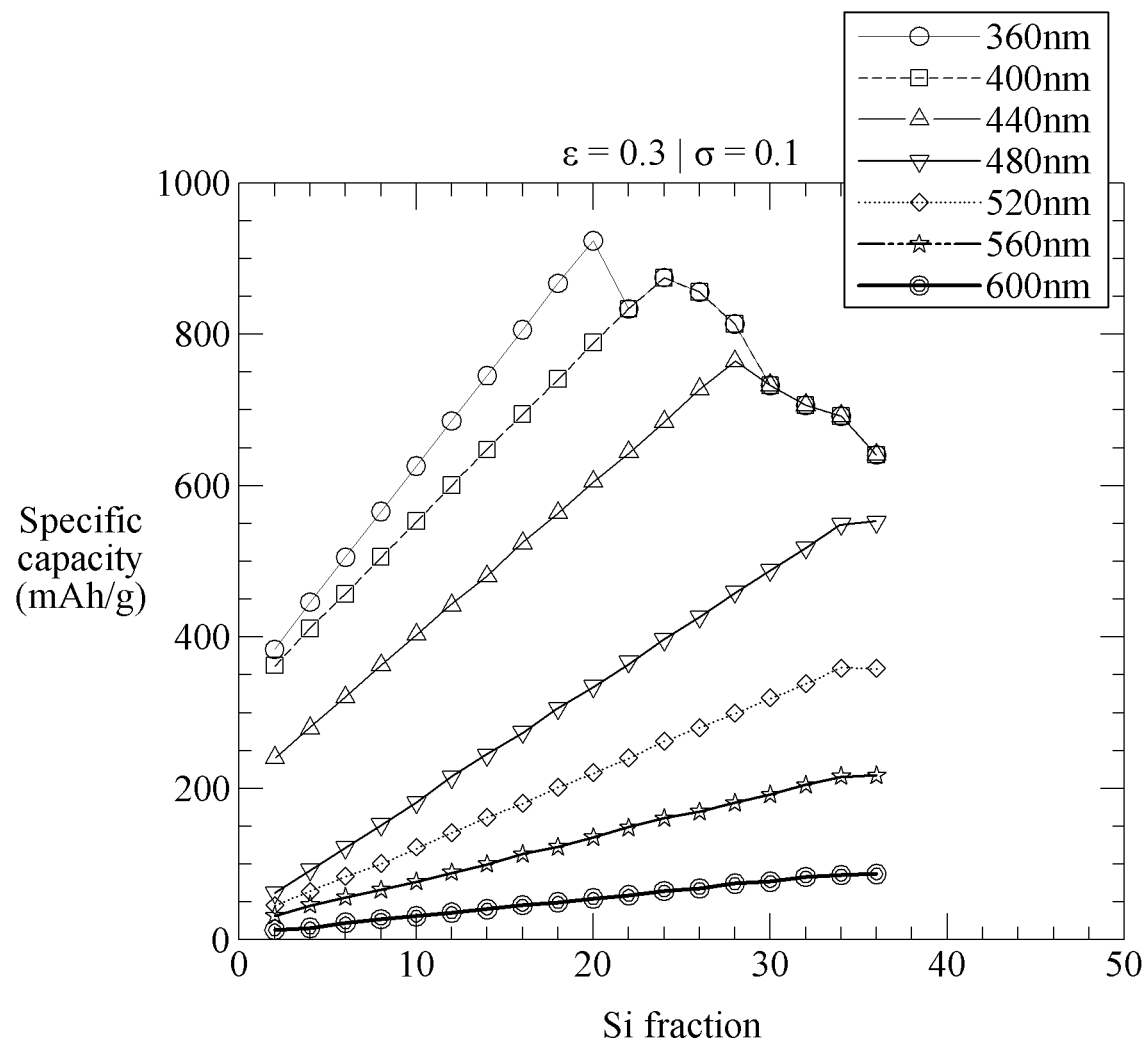
FIGS. 8A to 8C are graphs illustrating examples of a specific capacity of an electrode for different particle sizes.
Figure 8B:
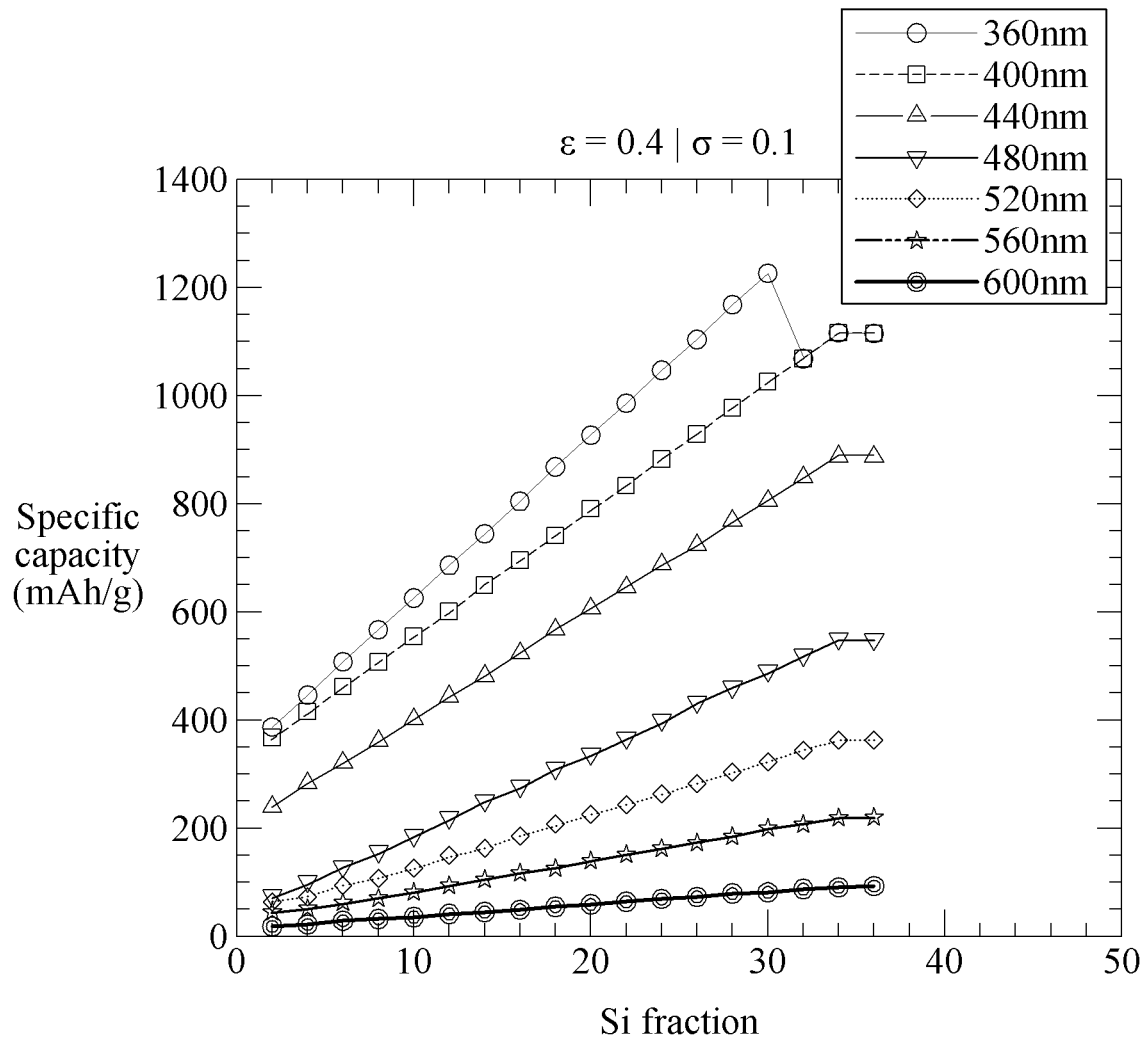
Figure 8C:
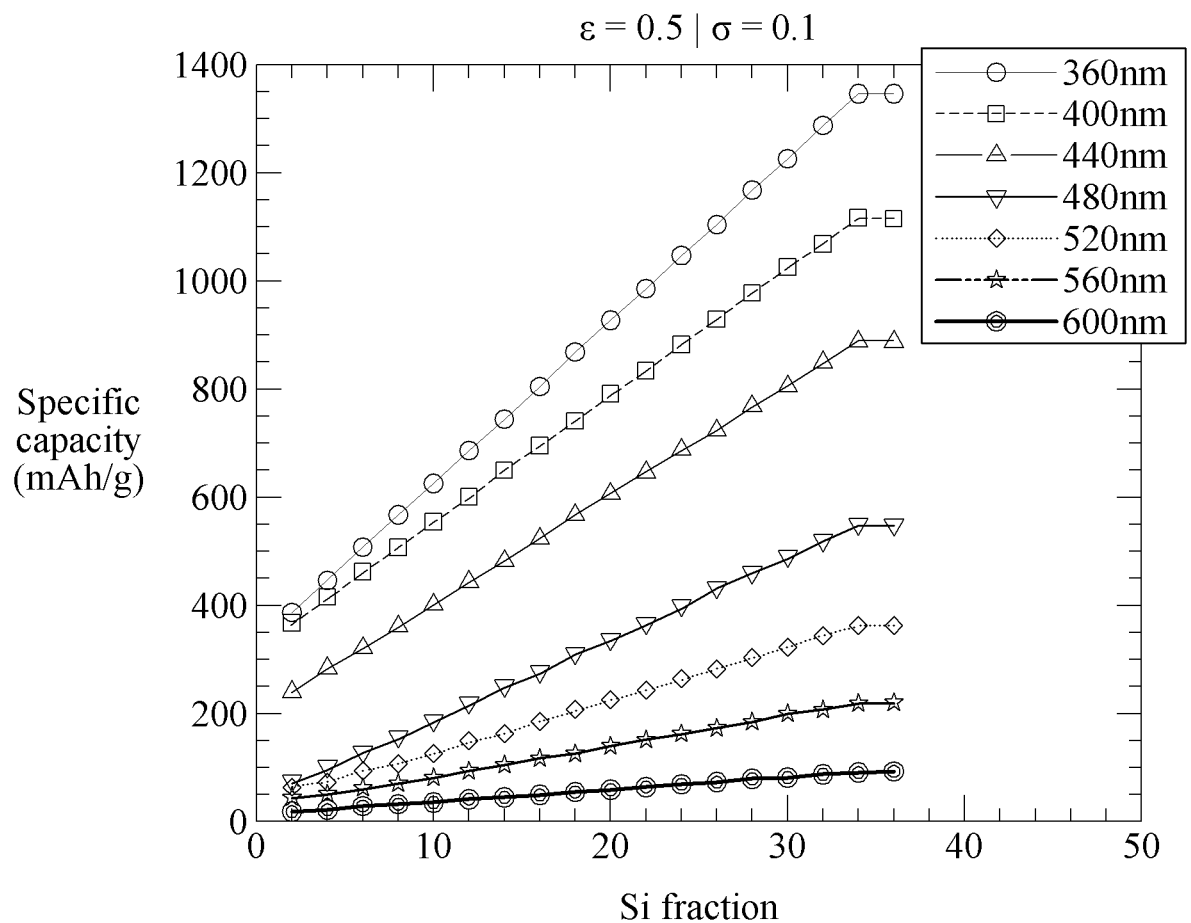

FIGS. 8A to 8C are graphs illustrating examples of a specific capacity of an electrode for different particle sizes.

As shown in FIG. 8A, an x axis represents an Si fraction, and a y-axis represents a specific capacity in mAh/g. A maximum allowable swelling $N_s$ of the electrode is "0.1." An initial electrode porosity $Eps_0$ is "0.3" and a particle size ranges from 360 nm to 600 nm.

As shown in FIG. 8B, an x axis represents an Si fraction, and a y-axis represents a specific capacity in mAh/g. A maximum allowable swelling $N_s$ of the electrode is "0.1." An initial electrode porosity $Eps_0$ is "0.4" and a particle size ranges from 360 nm to 600 nm.

As shown in FIG. 8C, an x axis represents an Si fraction, and a y-axis represents a specific capacity in mAh/g. A maximum allowable swelling $N_s$ of the electrode is "0.1." An initial electrode porosity $Eps_0$ is "0.5" and a particle size ranges from 360 nm to 600 nm.

Figure 9A:
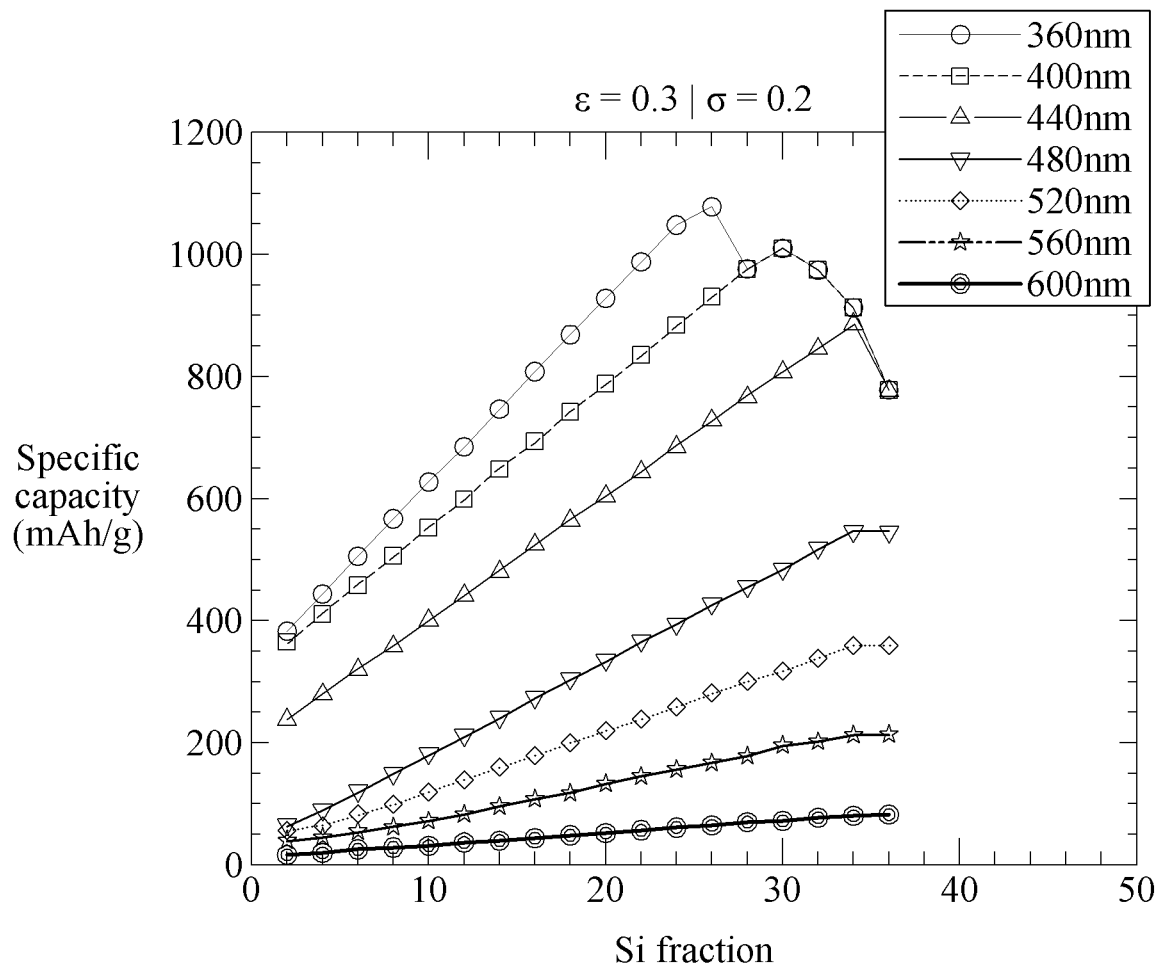
FIGS. 9A to 9C are graphs illustrating examples of a specific capacity of an electrode for different particle sizes.
Figure 9B:
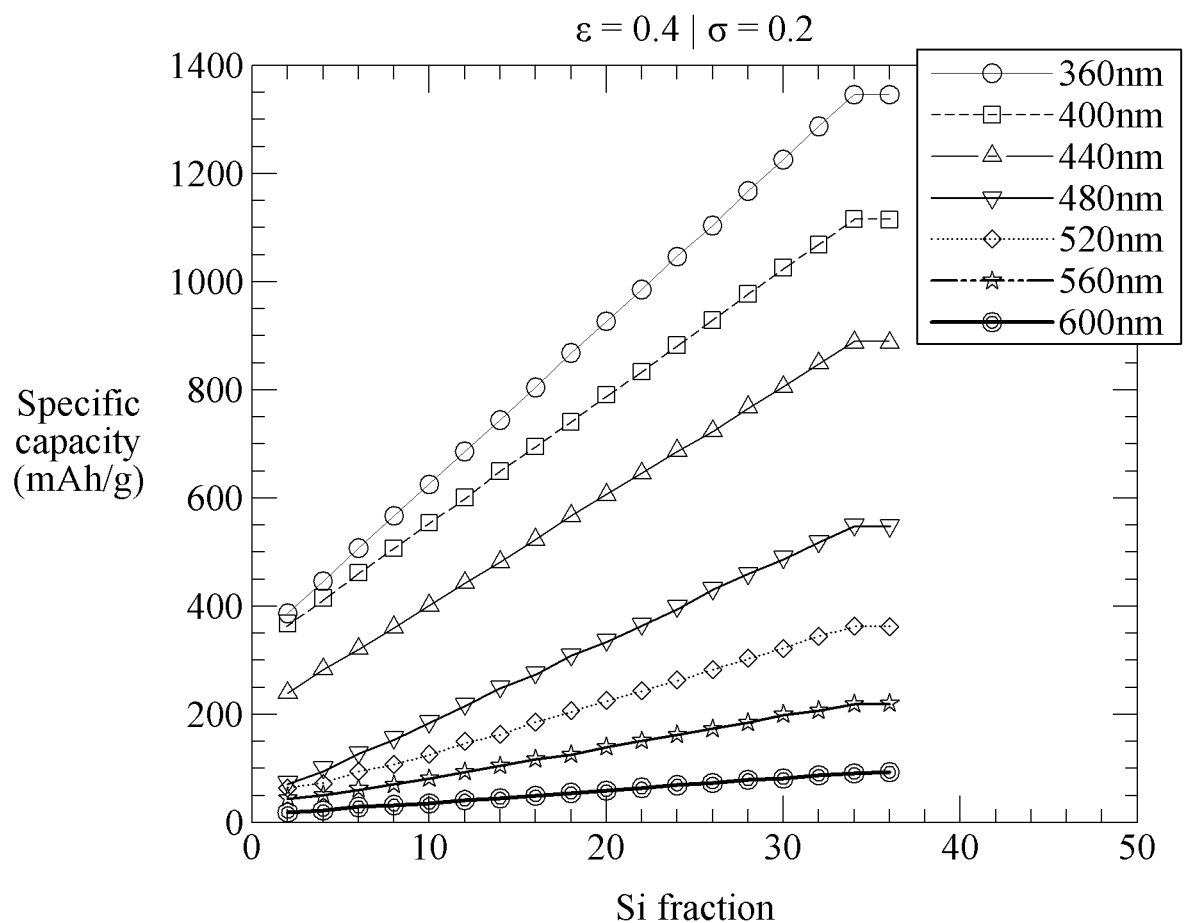
Figure 9C:
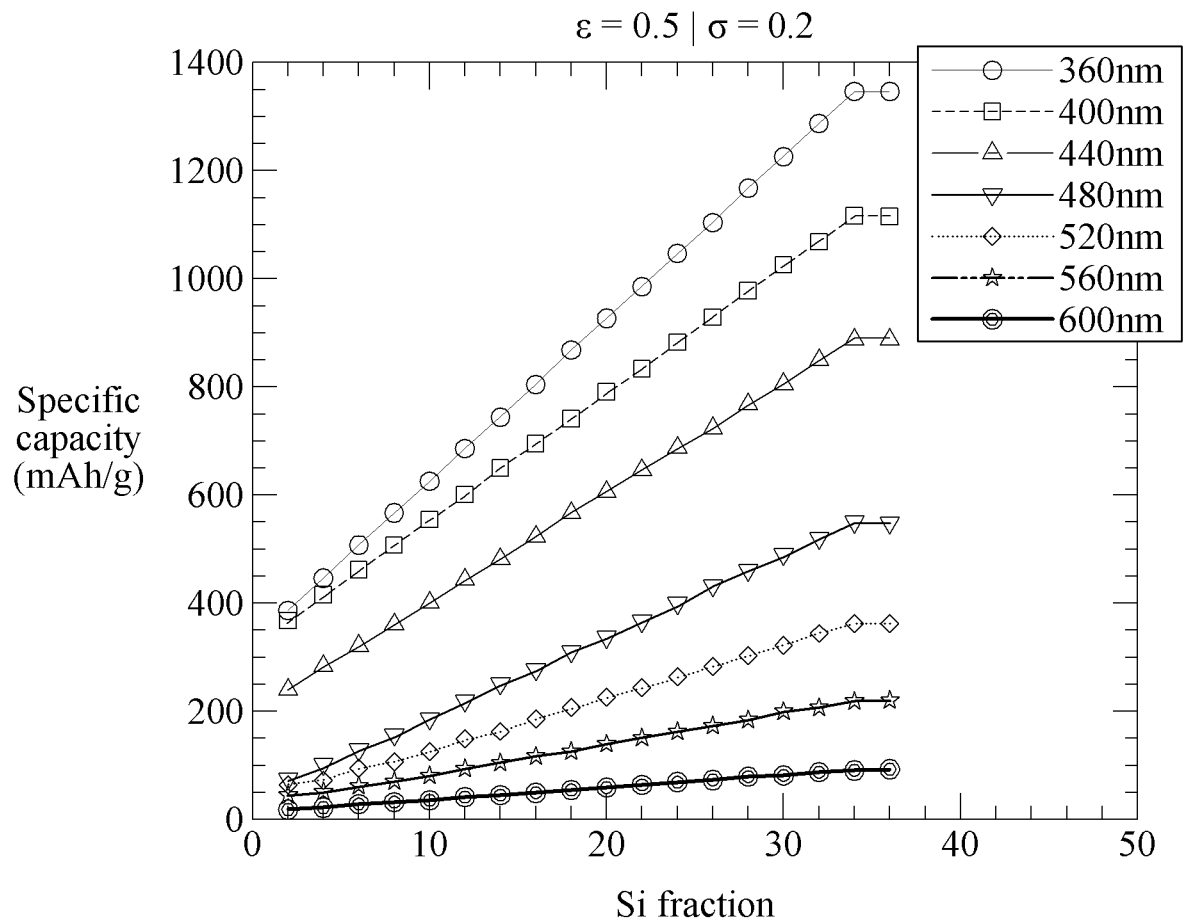

FIGS. 9A to 9C are graphs illustrating examples of a specific capacity of an electrode for different particle sizes.

As shown in FIG. 9A, an x axis represents an Si fraction, and a y-axis represents a specific capacity in mAh/g. A maximum allowable swelling $N_s$ of the electrode is "0.2." An initial electrode porosity $Eps_0$ is "0.3" and a particle size ranges from 360 nm to 600 nm.

As shown in FIG. 9B, an x axis represents an Si fraction, and a y-axis represents a specific capacity in mAh/g. A maximum allowable swelling $N_s$ of the electrode is "0.2." An initial electrode porosity $Eps_0$ is "0.4" and a particle size ranges from 360 nm to 600 nm.

As shown in FIG. 9C, an x axis represents an Si fraction, and a y-axis represents a specific capacity in mAh/g. A maximum allowable swelling $N_s$ of the electrode is "0.2." An initial electrode porosity $Eps_0$ is "0.5" and a particle size ranges from 360 nm to 600 nm.

Figure 10:
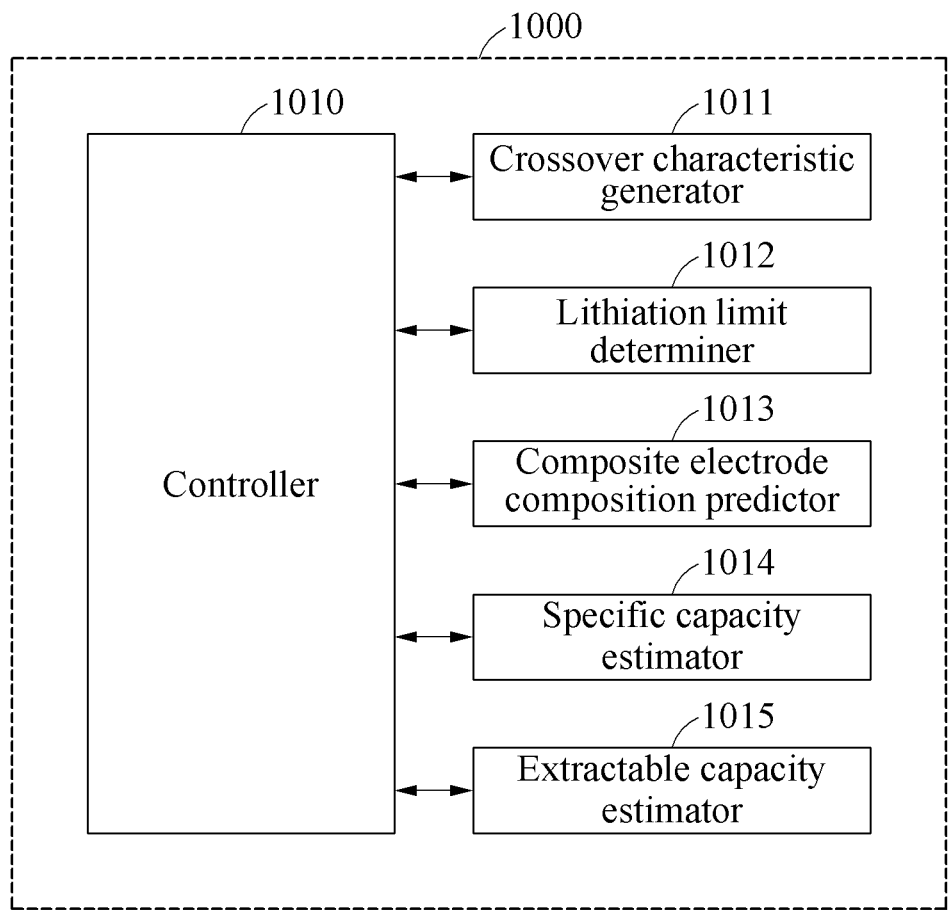
FIG. 10 illustrates an example of a configuration of an apparatus for estimating a maximum specific capacity of a composite electrode.

FIG. 10 illustrates an example of a configuration of an apparatus for estimating a maximum specific capacity of a composite electrode.

Referring to FIG. 10, an apparatus 1000 (hereinafter, referred to as a "specific capacity estimation apparatus 1000") for estimating a maximum specific capacity may include a controller 1010, a crossover characteristic generator 1011, a lithiation limit determiner 1012, a composite electrode composition predictor 1013, a specific capacity estimator 1014, and an extractable capacity estimator 1015.

The crossover characteristic generator 1011 may generate OCP crossover characteristics of a composite electrode that includes Si and C.

The crossover characteristic generator 1011 may determine an OCP characteristic of the Si in the composite electrode, may determine an OCP characteristic of the C in the composite electrode, and may generate OCP crossover characteristics of the composite electrode based on the determined OCP characteristic of the Si and the determined OCP characteristic of the natural C.

The lithiation limit determiner 1012 may determine a lithiation limit of the composite electrode based on a lithiation limit of the Si.

The lithiation limit determiner 1012 may determine a lithiation limit for a preset particle size of the Si, may determine a lithiation limit fora preset particle size of the composite electrode based on the lithiation limit for the preset particle size of the Si, and may determine a lithiation limit for the entire composite electrode based on the lithiation limit for the preset particle size of the Si.

The composite electrode composition predictor 1013 may predict a composition of the composite electrode based on the determined lithiation limit of the composite electrode.

The composite electrode composition predictor 1013 may estimate a safe operating range of the Si in the composite electrode in which the Si does not fracture, based on the lithiation limit of the composite electrode, may determine a composition of the Si in the composite electrode based on a maximum value of the Si in the estimated safe operating range, and may predict the composition of the composite electrode based on the maximum value of the Si in the composite electrode.

The specific capacity estimator 1014 may estimate a maximum specific capacity of the composite electrode based on the predicted composition of the composite electrode. The maximum specific capacity of the composite electrode may be estimated based on any one or any combination of an operating range of the composite electrode, an initial porosity, and a maximum allowable swelling.

The extractable capacity estimator 1015 may estimate a maximum extractable capacity of the composite electrode based on the predicted composition of the composite electrode. The maximum extractable capacity of the composite electrode may be estimated based on any one or any combination of an operating range of the composite electrode, an initial porosity, and a maximum allowable swelling.

The controller 1010 may control an overall operation of the specific capacity estimation apparatus 1000. Also, the controller 1010 may perform a function of each of the crossover characteristic generator 1011, the lithiation limit determiner 1012, the composite electrode composition predictor 1013, the specific capacity estimator 1014, and the extractable capacity estimator 1015. The controller 1010, the crossover characteristic generator 1011, the lithiation limit determiner 1012, the composite electrode composition predictor 1013, the specific capacity estimator 1014, and the extractable capacity estimator 1015 are separately illustrated to distinguish between functions thereof. Thus, the controller 1010 may include at least one processor configured to perform respective functions of the crossover characteristic generator 1011, the lithiation limit determiner 1012, the composite electrode composition predictor 1013, the specific capacity estimator 1014, and the extractable capacity estimator 1015. Also, the controller 1010 may include at least one processor configured to perform a portion of the respective functions of the crossover characteristic generator 1011, the lithiation limit determiner 1012, the composite electrode composition predictor 1013, the specific capacity estimator 1014, and the extractable capacity estimator 1015.

Figure 11:
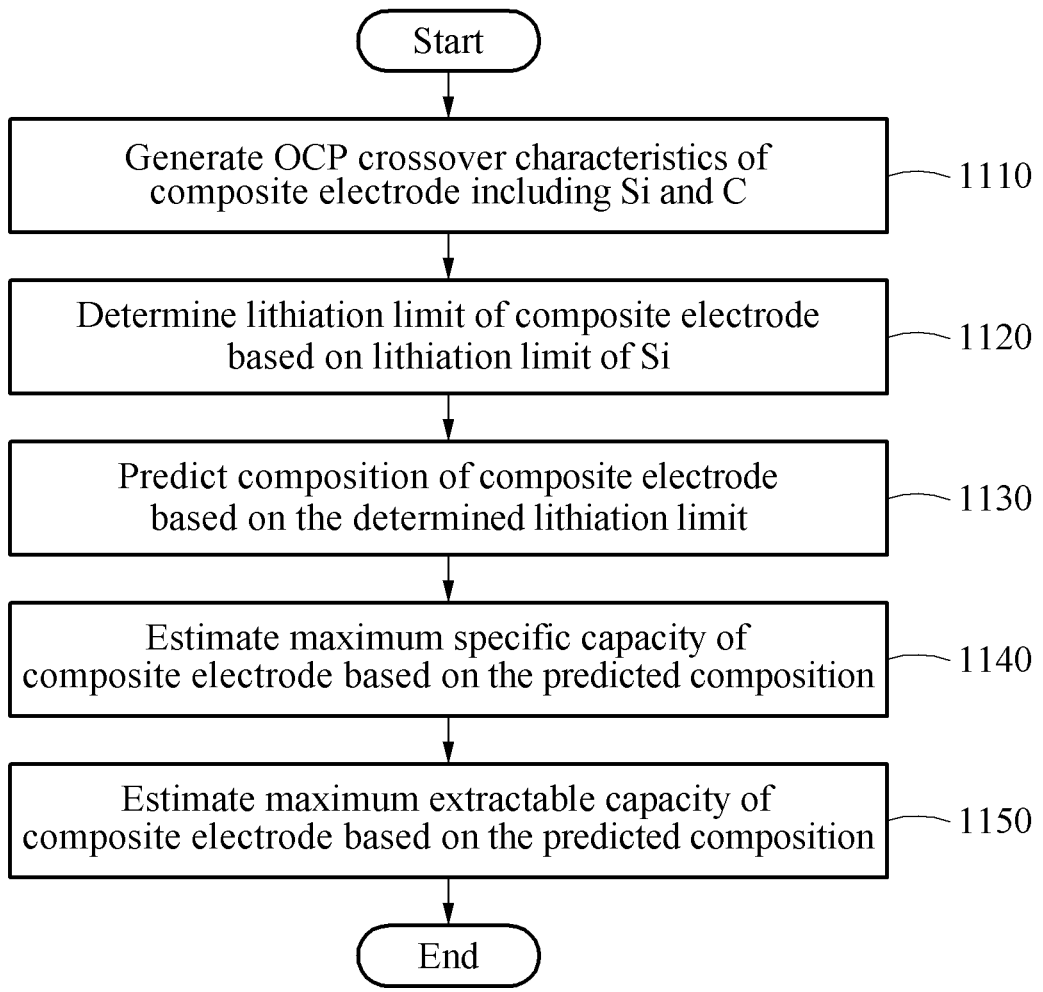
FIG. 11 illustrates an example of a process of estimating a maximum specific capacity of a composite electrode in an apparatus for estimating a specific capacity.

FIG. 11 illustrates an example of a process of estimating a maximum specific capacity of a composite electrode in an apparatus for estimating a specific capacity.

In operation 1110, the specific capacity estimation apparatus 1000 of FIG. 10 may generate OCP crossover characteristics of a composite electrode that includes Si and C.

In operation 1110, the specific capacity estimation apparatus 1000 may determine an OCP characteristic of the Si in the composite electrode, may determine an OCP characteristic of the C in the composite electrode, and may generate OCP crossover characteristics of the composite electrode based on the determined OCP characteristic of the Si and the determined OCP characteristic of the C.

In operation 1120, the specific capacity estimation apparatus 1000 may determine a lithiation limit of the composite electrode based on a lithiation limit of the Si.

In operation 1120, the specific capacity estimation apparatus 1000 may determine a lithiation limit for a preset particle size of the Si, may determine a lithiation limit for a preset particle size of the composite electrode based on the lithiation limit for the preset particle size of the Si, and may determine a lithiation limit for the entire composite electrode based on the lithiation limit for the preset particle size of the Si.

In operation 1130, the specific capacity estimation apparatus 1000 may predict a composition of the composite electrode based on the determined lithiation limit of the composite electrode.

In operation 1130, the specific capacity estimation apparatus 1000 may estimate a safe operating range of the Si in the composite electrode in which the Si does not fracture, based on the lithiation limit of the composite electrode, may determine a composition of the Si in the composite electrode based on a maximum value of the Si in the estimated safe operating range, and may predict the composition of the composite electrode based on the maximum value of the Si in the composite electrode.

In operation 1140, the specific capacity estimation apparatus 1000 may estimate a maximum specific capacity of the composite electrode based on the predicted composition of the composite electrode.

In operation 1150, the specific capacity estimation apparatus 1000 may estimate a maximum extractable capacity of the composite electrode based on the predicted composition of the composite electrode.

The maximum specific capacity and the maximum extractable capacity of the composite electrode may be estimated based on any one or any combination of an operating range of the composite electrode, an initial porosity, and a maximum allowable swelling.

The specific capacity estimation apparatus 1000, controller 1010, crossover characteristic generator 1011, lithiation limit determiner 1012, composite electrode composition predictor 1013, specific capacity estimator 1014, and an extractable capacity estimator 1015 in FIGS. 2-11 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2-11 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method of estimating a maximum specific capacity of a composite electrode, the method comprising:
generating open circuit potential (OCP) crossover characteristics of the composite electrode comprising silicon and natural graphite;
determining a composite electrode lithiation limit of the composite electrode based on a silicon lithiation limit of the silicon dependent on the generated OCP crossover characteristics;
predicting a composite electrode composition of the composite electrode based on the composite electrode lithiation limit; and
estimating the maximum specific capacity of the composite electrode based on the composite electrode composition.

2. The method of claim 1, further comprising:
estimating a maximum extractable capacity of the composite electrode based on the composite electrode composition.

3. The method of claim 2, wherein the maximum extractable capacity of the composite electrode is estimated based on at least one of an operating range of the composite electrode, an initial porosity, or a maximum allowable swelling.

4. The method of claim 1, wherein the generating of the OCP crossover characteristics of the composite electrode comprises:
determining a silicon OCP characteristic of the silicon in the composite electrode;
determining a natural graphite OCP characteristic of the natural graphite in the composite electrode; and
generating the OCP crossover characteristics of the composite electrode based on the silicon OCP characteristic and the natural graphite OCP characteristic.

5. The method of claim 1, wherein the determining of the composite electrode lithiation limit based on the silicon lithiation limit comprises:
determining a preset particle size silicon lithiation limit for a preset particle size of the silicon;
determining a preset particle size composite electrode lithiation limit for a preset particle size of the composite electrode based on the preset particle size silicon lithiation limit; and
determining an entire composite electrode lithiation limit for an entire composite electrode based on the preset particle size silicon lithiation limit.

6. The method of claim 1, wherein the predicting of the composite electrode composition of the composite electrode based on the composite electrode lithiation limit comprises:
estimating a safe operating range of the silicon in the composite electrode in which the silicon does not fracture, based on the composite electrode lithiation limit;
determining a composition of the silicon in the composite electrode based on a maximum value of the silicon in the estimated safe operating range; and
predicting the composite electrode composition based on the maximum value of the silicon in the composite electrode.

7. The method of claim 1, wherein the maximum specific capacity of the composite electrode is estimated based on at least one of an operating range of the composite electrode, an initial porosity, or a maximum allowable swelling.

8. A non-transitory computer-readable storage medium storing instructions that, when executed by one or more processors, configure the one or more processors to perform the method of claim 1.

9. An apparatus for estimating a specific capacity of an electrode, the apparatus comprising:
one or more processors configured to:
generate open circuit potential (OCP) crossover characteristics of a composite electrode comprising silicon and natural graphite;
determine a composite electrode lithiation limit of the composite electrode based on a silicon lithiation limit of the silicon dependent on the generated OCP crossover characteristics;
predict a composite electrode composition of the composite electrode based on the composite electrode lithiation limit; and
estimate a maximum specific capacity of the composite electrode based on the composite electrode composition.

10. The data encoding apparatus of claim 9, further comprising a memory storing instructions that when executed by the one or more processor, configured the one or more processors to:
perform the generation of the OCP crossover characteristics, perform the determination of the composite electrode lithiation limit, perform the prediction of the composite electrode composition of the composite electrode, and perform the estimation of the maximum specific capacity of the composite electrode.

11. The apparatus of claim 10, wherein the one or more processors are further configured to estimate a maximum extractable capacity of the composite electrode based on the composite electrode composition.

12. The apparatus of claim 11, wherein the maximum extractable capacity of the composite electrode is estimated based on at least one of an operating range of the composite electrode, an initial porosity, or a maximum allowable swelling.

13. The apparatus of claim 10, wherein, for the generation of the crossover characteristics, the one or more processors are further configured to determine a silicon OCP characteristic of the silicon in the composite electrode, determine a natural graphite OCP characteristic of the natural graphite in the composite electrode, and generate the OCP crossover characteristics of the composite electrode based on the silicon OCP characteristic and the natural graphite OCP characteristic.

14. The apparatus of claim 10, wherein, for the determination of the composite electrode lithiation limit, the one or more processors are further configured to determine a preset particle size silicon lithiation limit for a preset particle size of the silicon, determine a preset particle size composite electrode lithiation limit for a preset particle size of the composite electrode based on the preset particle size silicon lithiation limit, and determine an entire composite electrode lithiation limit for an entire composite electrode based on the preset particle size silicon lithiation limit.

15. The apparatus of claim 10, wherein, for the prediction of the composite electrode composition, the one or more processors are further configured to estimate a safe operating range of the silicon in the composite electrode in which the silicon does not fracture, based on the composite electrode lithiation limit, determine a composition of the silicon in the composite electrode based on a maximum value of the silicon in the estimated safe operating range, and predict the composite electrode composition based on the maximum value of the silicon in the composite electrode.

16. The apparatus of claim 10, wherein the maximum specific capacity of the composite electrode is estimated based on at least one of an operating range of the composite electrode, an initial porosity, or a maximum allowable swelling.

* * * * *